United States Patent
Kodera

(10) Patent No.: US 7,236,905 B2
(45) Date of Patent: Jun. 26, 2007

(54) TEST APPARATUS AND POWER SUPPLY CIRCUIT

(75) Inventor: Satoshi Kodera, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/081,803

(22) Filed: Mar. 16, 2005

(65) Prior Publication Data

US 2006/0116843 A1    Jun. 1, 2006

(30) Foreign Application Priority Data

Nov. 30, 2004    (JP) ............... 2004-347659

(51) Int. Cl.
G01M 19/00    (2006.01)

(52) U.S. Cl. .................... 702/124

(58) Field of Classification Search .......... 702/124, 702/117, 116, 58, 59, 64, 60, 66; 324/771, 324/537, 555
See application file for complete search history.

(56) References Cited

U.S. PATENT DOCUMENTS

| | | | |
|---|---|---|---|
| 2002/0175662 A1* | 11/2002 | Sakurai et al. | ............... 323/312 |
| 2004/0113601 A1 | 6/2004 | Hashimoto | |
| 2006/0071682 A1* | 4/2006 | Hashimoto | .................. 324/771 |

FOREIGN PATENT DOCUMENTS

| | | |
|---|---|---|
| JP | 6-65912 | 9/1994 |
| JP | 2002-238429 | 8/2002 |
| JP | 2003-111396 | 4/2003 |

OTHER PUBLICATIONS

International Search Report issued for International application No. PCT/JP2005/021839 mailed on Feb. 28, 2006 and partial English translation thereof, 13 pages.

* cited by examiner

*Primary Examiner*—John Barlow
*Assistant Examiner*—Aditya S. Bhat
(74) *Attorney, Agent, or Firm*—Osha Liang LLP

(57) ABSTRACT

A power circuit which can reduce power consumption. More specifically, a testing apparatus for testing an electronic device which includes: a pattern generation unit for generating a test pattern which is supplied to the electronic device; a power supply circuit for supplying power to the electronic device; and a decision unit for deciding pass/fail of the electronic device based on an output signal output from the electronic device, wherein the power supply circuit has: a voltage source for generating a predetermined input voltage to be applied to the electronic device; a power device for supplying the power to the electronic device based on the input voltage generated by the voltage source; a power supply for supplying drive power of the power device; and a voltage control unit for controlling a drive voltage applied by the power supply to the power device based on the power output from the power device.

9 Claims, 9 Drawing Sheets

TEST APPARATUS AND POWER SUPPLY CIRCUIT

This application claims the benefit of Japanese Patent Application No. 2004-347659 filed on Nov. 30, 2004, the disclosure of which is incorporated herein by reference.

BACKGROUND OF THE INVENTION

1. Field of the Invention

The present invention relates to a testing apparatus for testing of electronic devices, and to a power supply circuit for use in such a testing apparatus or other like apparatus.

2. Description of Related Art

Conventionally, a testing apparatus which performs tests on electronic devices is provided with a power supply circuit for powering the testing apparatus. For example, the power supply circuit has a power device configured to generate a power supply voltage and a power supply current for supply to an electronic device, and a power supply for driving the power device.

For example, the power device has an amplification circuit for amplifying an applied input voltage and producing an output as a power supply voltage, a source-side circuit for supplying a source current to the electronic device according to the input voltage, and a sink-side circuit for drawing a sink current from the electric device according to the input voltage. Each of the source-side circuit and the sink-side circuit has a CMOS disposed between the power supply and the electronic device. A voltage according to the input voltage is supplied to a gate terminal of each of the CMOSs, and whether the power supply current is to be supplied to the electronic device from the power supply or it is drawn to the power supply from the electronic device, is controlled according to the input voltage.

In a conventional power supply circuit, however, the drive voltage, which is applied to the power device from the power supply, is constant. Besides, a differential between the drive voltage and the power supply voltage is supplied to the source-side. For example, when, at this time, the power supply voltage becomes extremely low, this causes application of a voltage of approximately the same level as the drive voltage to the source-side circuit and the sink-side circuit, with the result that the consumption of power in the power device increases.

Accordingly, an object of the present invention is to provide a testing apparatus and a power supply circuit which can solve the problems discussed above. The above and other objects can be achieved by combinations described in the independent claims. The dependent claims define further advantageous and exemplary combinations of the present invention.

SUMMARY OF THE INVENTION

According to a first aspect of the present invention, there is provided a testing apparatus for testing an electronic device, for the purpose of solving the aforesaid problem. This testing apparatus includes: a pattern generation unit for generating a test pattern which is supplied to the electronic device; a power supply circuit for supplying power to the electronic device; and a decision unit for deciding pass/fail of the electronic device based on an output signal output from the electronic device, wherein the power supply circuit has: a voltage source for generating a predetermined input voltage to be applied to the electronic device; a power device for supplying, based on the input voltage generated by the voltage source, the power to the electronic device; a power supply for supplying drive power of the power device; and a voltage control unit for controlling, based on the power output from the power device, a drive voltage applied by the power supply to the power device.

The power device may include: an amplification circuit for applying to the electronic device a voltage according to the input voltage; a source-side circuit for supplying a source current to the electronic device according to the input voltage; and a sink-side circuit for drawing a sink current from the electronic device according to the input voltage, and that the voltage control unit may include: a positive voltage control unit for controlling, based on the power output from the power device, a source-side drive voltage applied by the power supply to the source-side circuit; and a negative voltage control unit for controlling, based on the power output from the power device, a sink-side drive voltage applied by the power supply to the sink-side circuit.

The voltage control unit may detect a power supply voltage output from the power device, thereby to cause the drive voltage to increase when there is an increase in power supply voltage and to cause the drive voltage to decrease when there is a decrease in power supply voltage. Furthermore, the voltage control unit may control the drive voltage so that a differential between the power supply voltage and the drive voltage may be held substantially constant.

The voltage control unit may detect a power supply current output from the power device, thereby to cause the drive voltage to increase when there is a decrease in power supply current and to cause the drive voltage to decrease when there is an increase in power supply current. Furthermore, the voltage control unit may further detect a power supply voltage output from the power device, thereby to control the drive voltage so that the result of a subtraction of the power supply voltage from the drive voltage never falls below a predetermined value.

The power device may output a power supply voltage which is approximately equal to the input voltage, and that the voltage control unit detects the input voltage, thereby to control the drive voltage so that a differential between the power supply voltage and the input voltage is held substantially constant. Furthermore, the voltage control unit may include: an offset circuit, which is pre-fed the differential between the power supply voltage and the drive voltage to be controlled, for performing an addition of the differential to the detected power supply voltage; and a driver for controlling the drive voltage based on a differential between a predetermined reference voltage and the power supply voltage output from the offset circuit. Additionally, it may be arranged that the voltage control unit may further include a saturation prevention circuit for clamping the detected power supply voltage to within a predetermined voltage range.

According to a second aspect of the present invention, there is provided a power supply circuit for outputting a constant voltage which includes: a voltage source for generating an input voltage according to a voltage to be output; a power device for supplying power to outside of the power supply circuit based on the input voltage generated by the voltage source; a power supply for supplying drive power of the power device; and a voltage control unit for controlling, based on the power output from the power device, a drive voltage applied by the power supply to the power device.

The summary of the invention does not necessarily describe all necessary features of the present invention. The present invention may also be a sub-combination of the features described above.

DETAILED DESCRIPTION OF THE INVENTION

The invention will now be described based on preferred embodiments, which do not intend to limit the scope of the present invention, but exemplify the invention. All of the features and the combinations thereof described in the embodiments are not necessarily essential to the invention.

Figure 1:
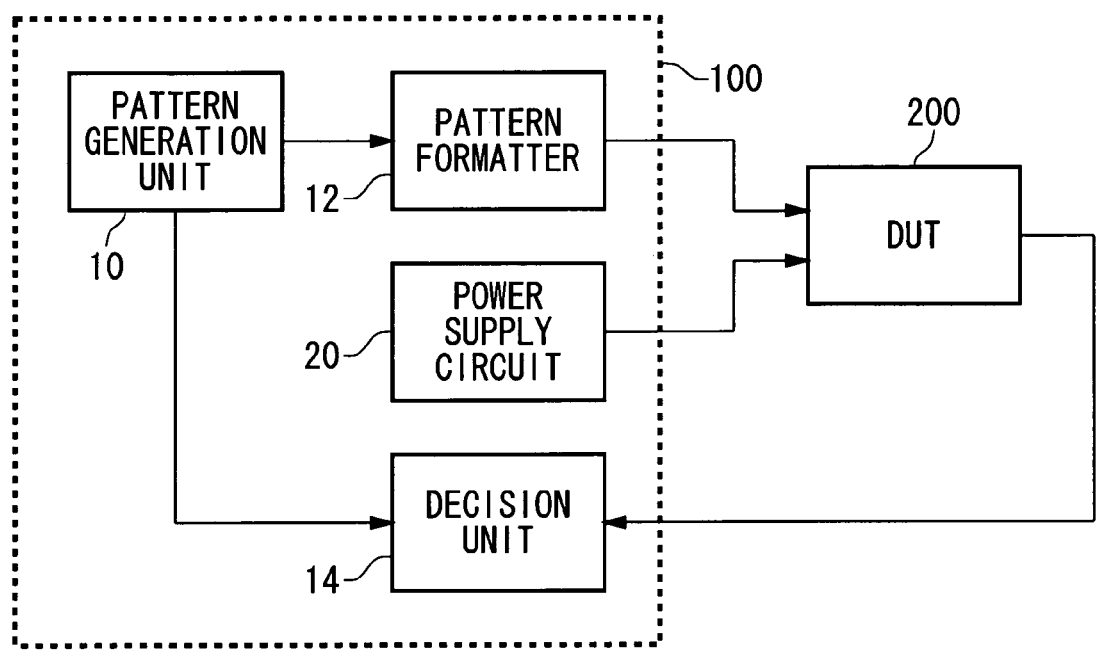
FIG. 1 shows an exemplary configuration of a testing apparatus according to an embodiment of the present invention.

With reference to FIG. 1, there is shown an exemplary configuration of a testing apparatus 100 formed in accordance with an embodiment of the present invention. The testing apparatus 100 is an apparatus configured to perform tests on an electronic device (DUT) 200 such as, for example, a semiconductor circuit. The testing apparatus 100 includes a pattern generation unit 10, a pattern formatter 12, a decision unit 14, and a power supply circuit 20.

The pattern generation unit 10 generates a test pattern which is to be supplied to the electronic device 200. For example, the pattern generation unit 10 generates a pattern which represents, in the form of an array of data values of logic "1" or logic "0", a signal to be supplied to the electronic device 200 and a pattern which represents the timing of supplying a signal according to a data value to the electronic device 200.

The pattern formatter 12 formats a test signal to be supplied to the electronic device 200 based on the test pattern generated by the pattern generation unit 10. In addition, the power supply circuit 20 supplies power for driving the electronic device 200.

In addition, the decision unit 14 makes a comparison between an output signal output from the electronic device 200 and an anticipated value signal which is generated by the pattern generation unit 10, thereby to decide pass/fail of the electronic device 200. In the present embodiment, the testing apparatus 100 decides the pass/fail of the electronic device 200 based on the output signal. Alternatively, in a testing apparatus according to another embodiment, it may be arranged that detection of a power supply current which is supplied to the electronic device 200 from the power supply circuit 20 is made, thereby to decide the pass/fail of the electronic device 200 based on the detected power supply current.

Figure 2:
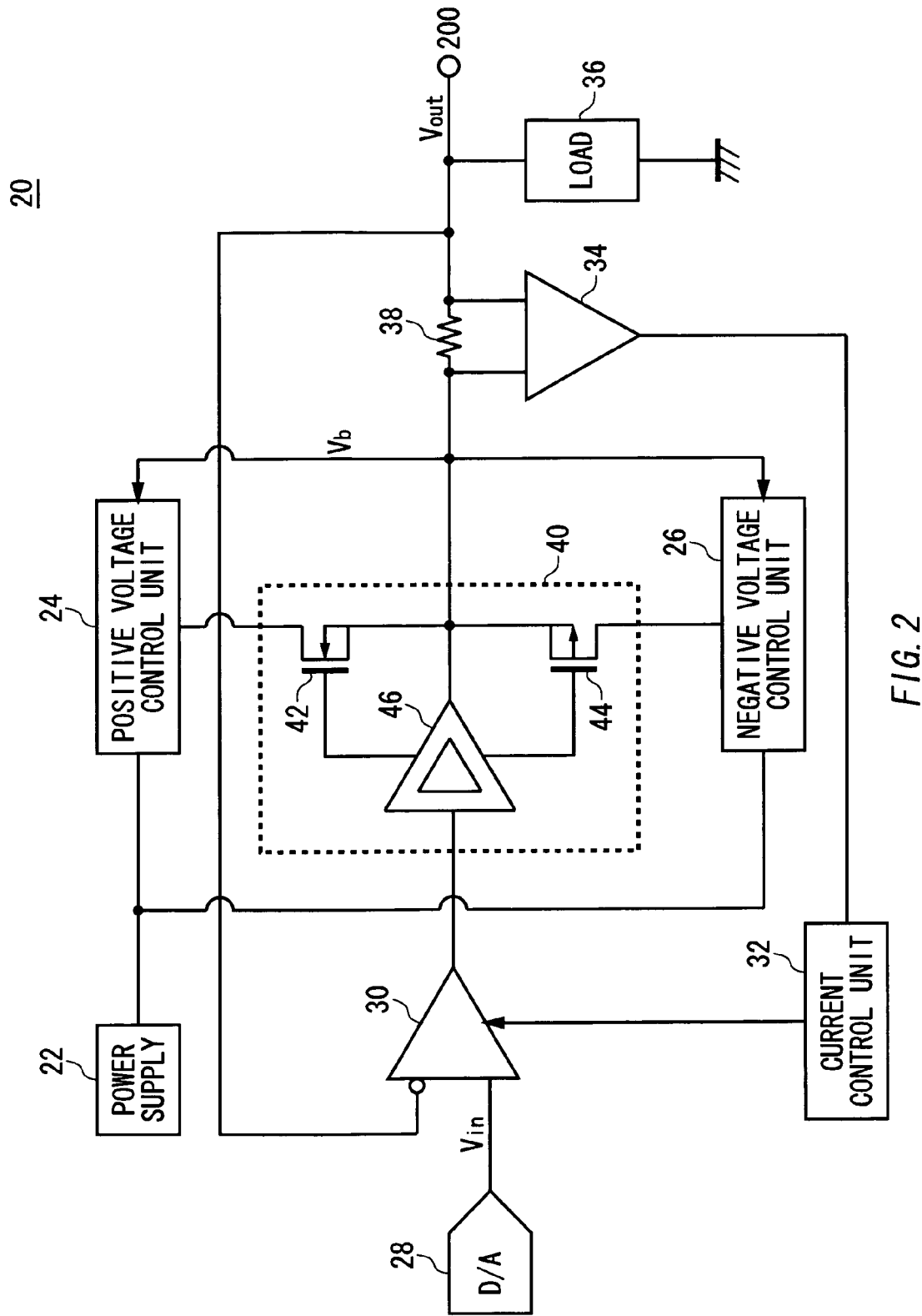
FIG. 2 shows an exemplary configuration of a power supply circuit.

With reference to FIG. 2, there is shown an exemplary configuration of the power supply circuit 20. The power supply circuit 20 has a digital/analog converter 28 which acts as a voltage source (hereinafter referred to as the D/A 28), a power supply 22, a positive voltage control unit 24, a negative voltage control unit 26, a differential amplifier 30, a current control unit 32, a power device 40, a current detection resistor 38, a current detection unit 34, and a load 36.

Digital data indicative of the value of a voltage to be applied to the electronic device 200 is supplied to the D/A 28, and the D/A 28 generates an input voltage according to the digital data. The power device 40 receives the input voltage through the differential amplifier 30, and supplies power to the electronic device 200 based on the input voltage. The power supply 22 is a power source for supplying drive power of the power device 40.

In addition, a power supply voltage, which is supplied to the electronic device 200 from an output terminal, is fed back to the differential amplifier 30, so that the voltage which is supplied to the power device 40 may be controlled in order to make the power supply voltage become equal to the input voltage output from the D/A 28. As a result of such a configuration, an accurate power supply voltage may be supplied to the electronic device 200 by the power supply circuit 20.

The current detection resistor 38 is connected between the output terminal connected to the electronic device 200 and the power device 40. The current detection unit 34 detects a potential difference across the current detection resistor 38 and supplies the detected value to the current control unit 32. The current control unit 32 controls the voltage output from the differential amplifier 30 so that the potential difference detected by the current detection unit 34 never exceeds a predetermined value. As a result of such a configuration, an over-current to the electronic device 200 may be prevented by the power supply circuit 20.

Each of the positive voltage control unit 24 and the negative voltage control unit 26 is a voltage control unit for controlling the drive voltage applied from the power supply 22 to the power device 40. More specifically, the voltage control unit controls the drive voltage applied by the power supply 22 to the power device 40 based on the power output from the power device 40. In the present embodiment, the voltage control unit detects a power supply voltage output from the power device 40, and increases the drive voltage applied to the power device 40 when there is an increase in power supply voltage and decreases the drive voltage applied to the power device 40 when there is a decrease in power supply voltage. In addition, it is preferable that the voltage control unit controls the drive voltage so that the differential between the power supply voltage and the drive voltage may be held substantially constant. That is, the drive voltage applied to the power device 40 is varied with changes in the power supply voltage output from the power device 40. By such control, unnecessary power consumption in the power device 40 is reduced.

The power device 40 has an amplification circuit 46, a source-side circuit 42, and a sink-side circuit 44. The amplification circuit 46 generates a power supply voltage according to an applied input voltage, for application to the electronic device 200 via the current detection resistor 38. In the present embodiment, the amplification circuit 46 generates a power supply voltage approximately equal to an input voltage applied thereto.

The source-side circuit 42 supplies a source current to the electronic device 200 through the current detection resistor 38 according to an input voltage. In the present embodiment, the source-side circuit 42 is disposed between the power supply 22 and the electronic device 200, and has a p-type CMOS with a gate terminal at which a voltage according to the input voltage is applied. This CMOS turns on when the input voltage exceeds a predetermined value, whereby a source current from the power supply 22 is supplied to the electronic device 200.

The sink-side circuit 44 draws a sink current from the electronic device 200 through the current detection resistor 38 according to an input voltage. In the present embodiment, the sink-side circuit 44 is disposed between the power supply 22 and the electronic device 200, and has an n-type CMOS with a gate terminal at which a voltage according to the input voltage is applied. This CMOS turns on when the input voltage falls below a predetermined value, whereby a sink current is drawn in to the power supply 22 from the electronic device 200.

The positive voltage control unit 24 is disposed between the power supply 22 and the source-side circuit 42, and controls, based on the power output from the power device 40, a source-side drive voltage applied by the power supply 22 to the source-side circuit 42. For example, the positive voltage control unit 24 controls the source-side drive voltage so that the differential between the power supply voltage and the source-side drive voltage may be held at an approximately constant value, as described above.

The negative voltage control unit 26 is disposed between the power supply 22 and the sink-side circuit 44, and controls, based on the power output from the power device 40, a sink-side drive voltage applied by the power supply 22 to the sink-side circuit 44. For example, the negative voltage control unit 26 controls the sink-side drive voltage so that the differential between the power supply voltage and the sink-side drive voltage may be held at an approximately constant value, as described above.

In a conventional power supply circuit, each of a source-side and a sink-side circuit of a power device is provided with an individual power supply. In accordance with the power supply circuit 20 of the present embodiment, since a common power supply 22 is provided to the source-side circuit 42 and the sink-side circuit 44, the capacity of the power supply 22 may be approximately a half that of that of the conventional power supply circuit. In the power supply circuit 20 of the present embodiment, when the power device 40 outputs a large current, only one of the source-side circuit 42 and the sink-side circuit 44 operates in the power device 40. Therefore, even if employing the common power supply 22, there is no inconvenience.

Figure 3:
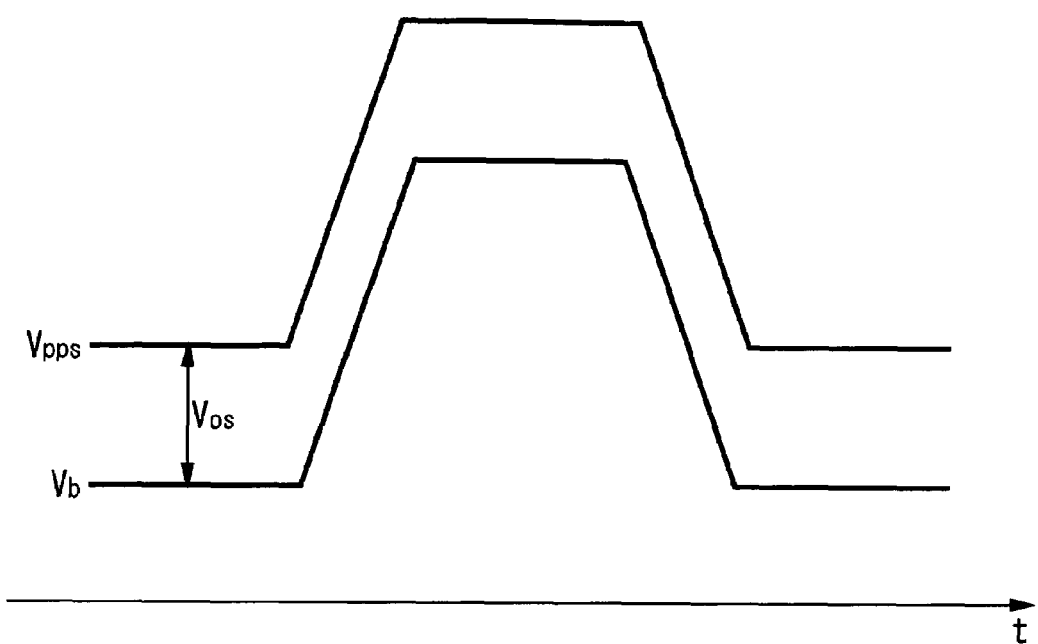
FIG. 3 shows an exemplary waveform of the source-side drive voltage ($V_{PPS}$) which is applied by a positive voltage control unit to a source-side circuit.

With reference to FIG. 3, there is shown an exemplary waveform of the source-side drive voltage ($V_{PPS}$) which is applied by the positive voltage control unit 24 to the source-side circuit 42. As already described above, the positive voltage control unit 24 controls the source-side drive voltage $V_{PPS}$ so that the differential between the power supply voltage (Vb) and the source-side drive voltage $V_{PPS}$ may become an approximately constant voltage ($V_{OS}$). In addition, in the present embodiment, the description has been made only in terms of the source-side drive voltage $V_{PPS}$. Likewise, the negative voltage control unit 26 also controls the sink-side drive voltage ($V_{MPS}$). For example, the negative voltage control unit 26 controls the sink-side drive voltage $V_{MPS}$ so that it may become a voltage having a voltage value obtained by subtracting the predetermined voltage value $V_{OS}$ from the power supply voltage Vb.

By such control, it becomes possible to prevent application of an excessive voltage to the source-side circuit 42 and the sink-side circuit 44. Therefore, this makes it possible to reduce unnecessary power consumption in the source-side circuit 42 and the sink-side circuit 44.

Figure 4:
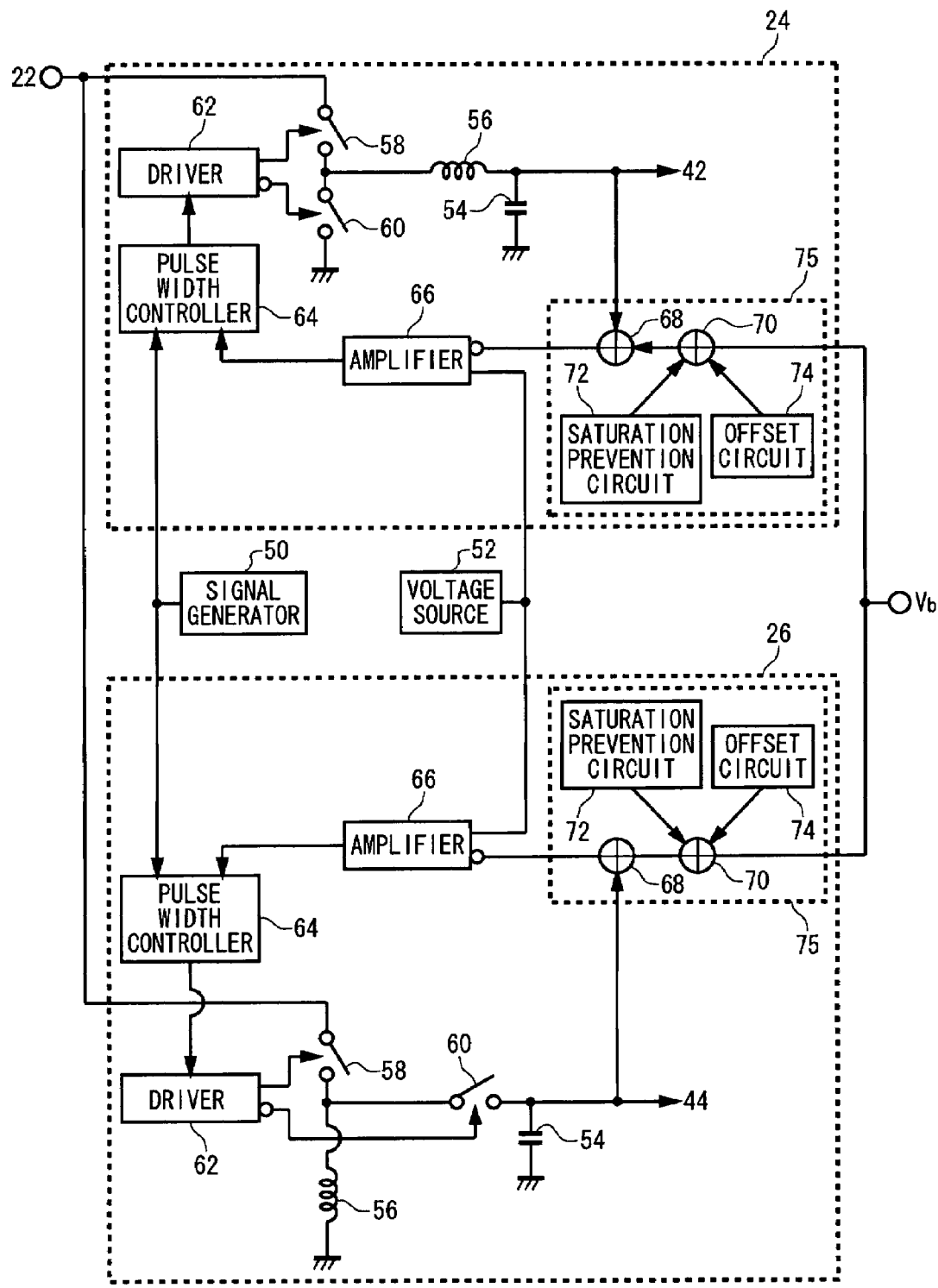
FIG. 4 shows an exemplary configuration of the positive voltage control unit and an exemplary configuration of a negative voltage control unit.

With reference to FIG. 4, there are shown exemplary configurations of the positive voltage control unit 24 and the negative voltage control unit 26. The positive voltage control unit 24 and the negative voltage control unit 26 are substantially identical in configuration with each other, each having a driver 62, a pulse width controller 64, an amplifier 66, a limit circuit 75, switches (58, 60), an inductive component 56, and a capacitor 54. In addition, the positive voltage control unit 24 and the negative voltage control unit 26 share a signal generator 50 and a voltage source 52. The signal generator 50 is a circuit configured to generate a periodic signal of predetermined frequency. The voltage source 52 outputs a predetermined reference voltage.

Next, the operation of the positive voltage control unit 24 will be described as an example. The amplifier 66 receives from the limit circuit 75 a voltage according to the power supply voltage Vb, amplifies a differential between the received voltage and the referential voltage, and outputs the result of amplification of the differential. Based on the output voltage from the amplifier 66, the pulse width controller 64 controls the pulse width of a periodic signal.

Based on the periodic signal which is pulse-width controlled by the pulse width controller 64, the driver 62 controls the source-side drive voltage $V_{PPS}$. In the present embodiment, the driver 62 places the switch 58 in the on state and places the switch 60 in the off state when the periodic signal is indicative of "HIGH" level. On the other hand, when the periodic signal is indicative of "LOW" level, the switch 58 and the switch 60 are placed in the off state and in the on state, respectively. The switch 58 and the switch 60 are disposed serially between the power supply 22 and ground potential, and charge and discharge the capacitor 54 through the inductive component 56 by the potential at a point where the switch 58 and the switch 60 are connected together.

That is, it is possible to control the source-side drive voltage $V_{PPS}$ by controlling the duty ratio of a periodic signal which is fed to the driver 62. In the present embodiment, since the pulse width of a periodic signal is controlled according to the power supply voltage Vb, this makes it possible to control the source-side drive voltage $V_{PPS}$ according to the power supply voltage Vb.

Additionally, the limit circuit 75 has adding units (68, 70), a saturation prevention circuit 72, and an offset circuit 74. A differential ($V_{OS}$) between the power supply voltage Vb and the source-side drive voltage $V_{PPS}$, which is to be controlled to be constant, is pre-fed to the offset circuit 74, and it outputs an offset voltage according to the differential. The adding unit 70 receives the power supply voltage Vb which is output from the power device 40 and the offset voltage and adds them together. As a result of such a configuration, the difference between the power supply voltage Vb and the source-side drive voltage $V_{PPS}$ is controllable to the desired voltage value $V_{OS}$.

Additionally, the saturation prevention circuit 72 clamps the power supply voltage Vb received by the adding unit 70 to within a predetermined voltage range. In other words, when the power supply voltage Vb falls out of the predetermined voltage range, the power supply voltage Vb is converted into an upper limit of the voltage range. As a result of such a configuration, application of an excess voltage to the source-side circuit 42 is preventable. In addition, the adding unit 68 adds to a voltage output from the adding unit 70 the source-side drive voltage $V_{PPS}$ which is applied by the positive voltage control unit 24 to the source-side circuit 42, and outputs the sum to the amplifier 66. Since the operation of the negative voltage control unit 26 is substantially the same as that of the positive voltage control unit 24, the description thereof is omitted here.

Figure 5:
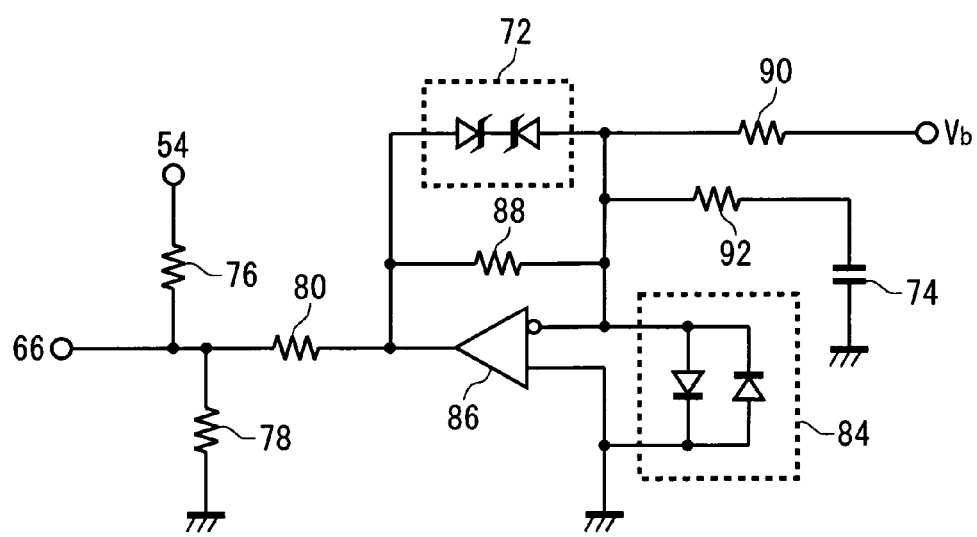
FIG. 5 shows an exemplary configuration of an offset circuit.

With reference to FIG. 5, there is shown an exemplary configuration of the limit circuit 75. The limit circuit 75 has a plurality of resistors (76, 78, 80, 88, 90, 92), a saturation prevention circuit 72, an offset circuit 74, an amplifier 86, and a protection circuit 84.

The amplifier 86 is implemented by a differential amplifier which receives, at a negative input terminal thereof, the power supply voltage Vb through the resistor 90 and whose positive input terminal is grounded. In other words, the amplifier 86 inverts a voltage which is input at the negative input terminal and outputs the result of the inversion of the input voltage.

The offset circuit 74 is a voltage source for outputting a predetermined offset voltage, and is connected, through the resistor 92, to the negative input terminal of the amplifier 86. More specifically, the offset circuit 74 performs addition of an offset voltage $V_{offset}$ to the power supply voltage Vb and supplies the sum to the negative input terminal of the amplifier 86.

The resistor 88 is connected between the negative input terminal and the output terminal of the amplifier 86. In addition, the saturation prevention circuit 72 clamps a difference in potential between the negative input terminal and the output terminal of the amplifier 86 to within a determined range. The saturation prevention circuit 72 may be disposed between the negative input terminal and the output terminal of the amplifier 86, and may have a plurality of zener diodes having different polarities.

In addition, the protection circuit 84 is a circuit by which the negative input terminal of the amplifier 86 is grounded upon application of a voltage with an absolute value in excess of a predetermined value to the negative input terminal of the amplifier 86. For example, it may be arranged that the protection circuit 84 is disposed between the negative input terminal of the amplifier 86 and ground potential, and has two diodes arranged in parallel with each other and having different polarities.

Generally, the voltage output from the amplifier 86 becomes—$(Vb+V_{offset})$. The output terminal of the amplifier 86 is connected, through the resistor 80, to a negative input terminal of the amplifier 66. Additionally, the negative input terminal of the amplifier 66 is connected, through the resistor 78, to ground potential, and receives a drive voltage (for example, the source-side drive voltage $V_{PPS}$) which is applied to the power device 40 through the resistor 76.

Since the amplifier 66 controls the drive voltage $V_{PPS}$ so that the voltage, which is input to the negative input terminal, may become equal to a reference voltage ($V_{ref}$) which is generated by the voltage source 52, this makes it possible to control the drive voltage according to the power supply voltage Vb.

For example, when all the resistors (76, 78, 80, 88, 90, 92) have the same resistance value, then the drive voltage $V_{PPS}$ is represented by the following equation:

$V_{PPS}=3\times V_{ref}+V_{offset}+Vb$

In addition, when the saturation prevention circuit 72 clamps the power supply voltage Vb of positive polarity, then the drive voltage $V_{PPS}$ is represented by the following equation:

$V_{PPS}=3\times V_{ref}+Vz1+Vd,$ where Vz1 represents the breakdown voltage of a forward-direction zener diode of the saturation prevention circuit 72 and Vd represents the drop voltage of that zener diode.

In addition, when the saturation prevention circuit 72 clamps the power supply voltage Vb of negative polarity, then the drive voltage $V_{PPS}$ is represented by the following equation:

$V_{PPS}=3\times V_{ref}-Vz2-Vd,$ where Vz2 represents the breakdown voltage of a backward-direction zener diode of the saturation prevention circuit 72 and Vd represents the drop voltage of that zener diode.

As just described above, according to the offset circuit 74 of the present embodiment, it becomes possible to cause a drive voltage to follow a power supply voltage by holding the differential between the power supply voltage and the drive voltage constant within a predetermined range. Consequently, it is possible to reduce any excess power consumption in the power device 40.

Figure 6:
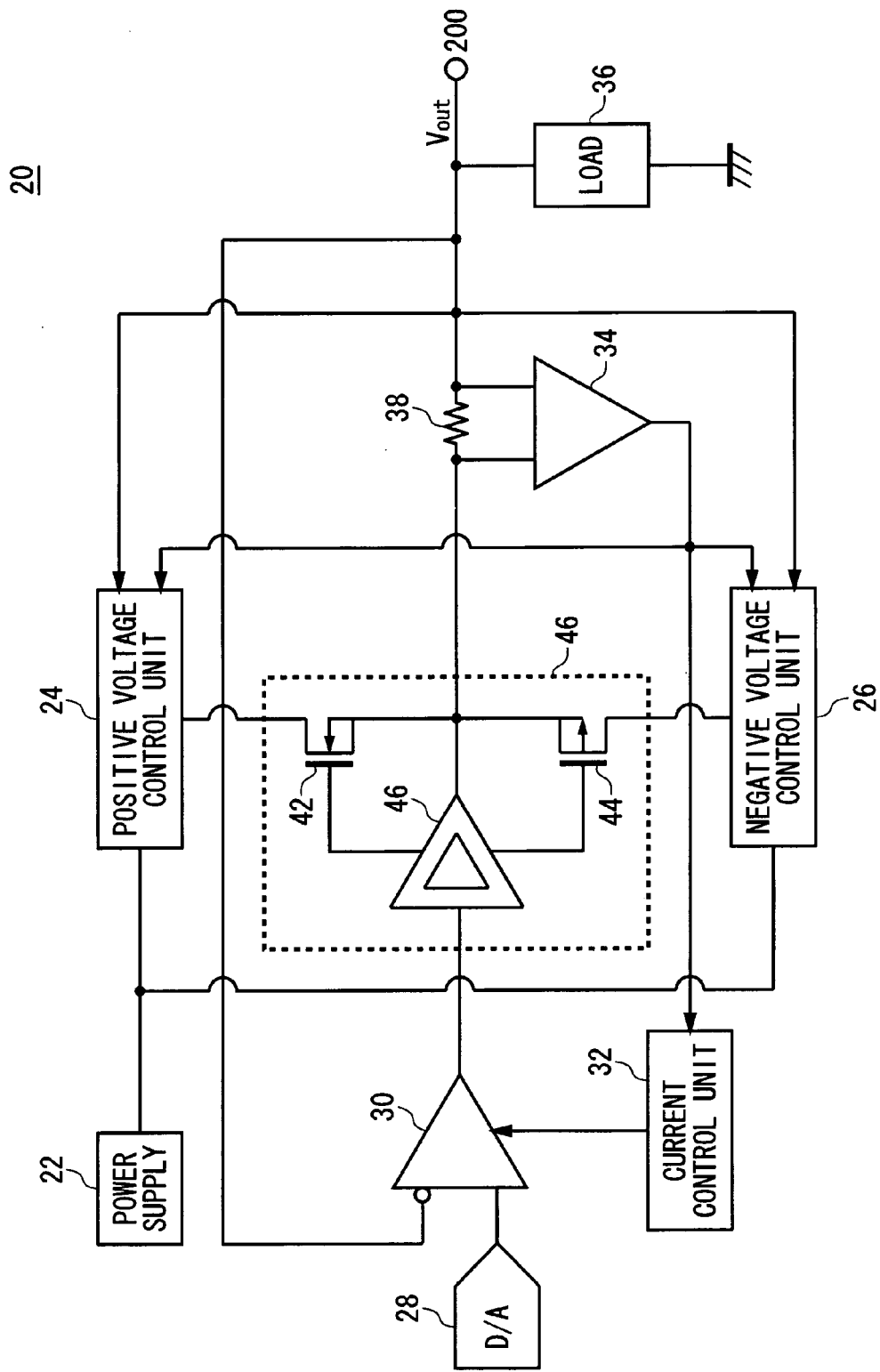
FIG. 6 shows another exemplary configuration of the power supply circuit 20.

With reference to FIG. 6, there is shown another exemplary configuration of the power supply circuit 20. The power supply circuit 20 of the present embodiment has the same components as the power supply circuits 20 described with reference to FIGS. 2-5. Components in FIG. 6 which bear the same reference numerals as in FIG. 2 may act and be configured in the same way as their counterpart components described in conjunction with FIG. 2.

The operation of the power supply circuit 20 of the present embodiment differs from that of the power supply circuit 20 described in conjunction with FIG. 2 in that control of the drive voltage is provided based on the power supply current detected by the current detection unit 34. More specifically, each voltage control unit of the present embodiment detects a power source current that the power device 40 outputs, thereby to cause the drive voltage to increase when there is detected a decrease in power supply current, and to cause the drive voltage to decrease when there is detected an increase in power supply current.

By such control, it becomes possible to accomplish drive voltage reduction when the power supply current is large. Consequently, the amount of consumption power in the power device 40 is reduced. In addition, for example, it is required that the source-side drive voltage, which is applied to the source-side circuit 42 of the power device 40, exceeds the power supply voltage that the power device 40 outputs by more than a predetermined value. To this end, the positive voltage control unit 24 further detects a power supply voltage output from the power device 40 and controls the source-side drive voltage so that the result of a subtraction of the power supply voltage from the source-side drive voltage never falls below a predetermined value.

Figure 7:
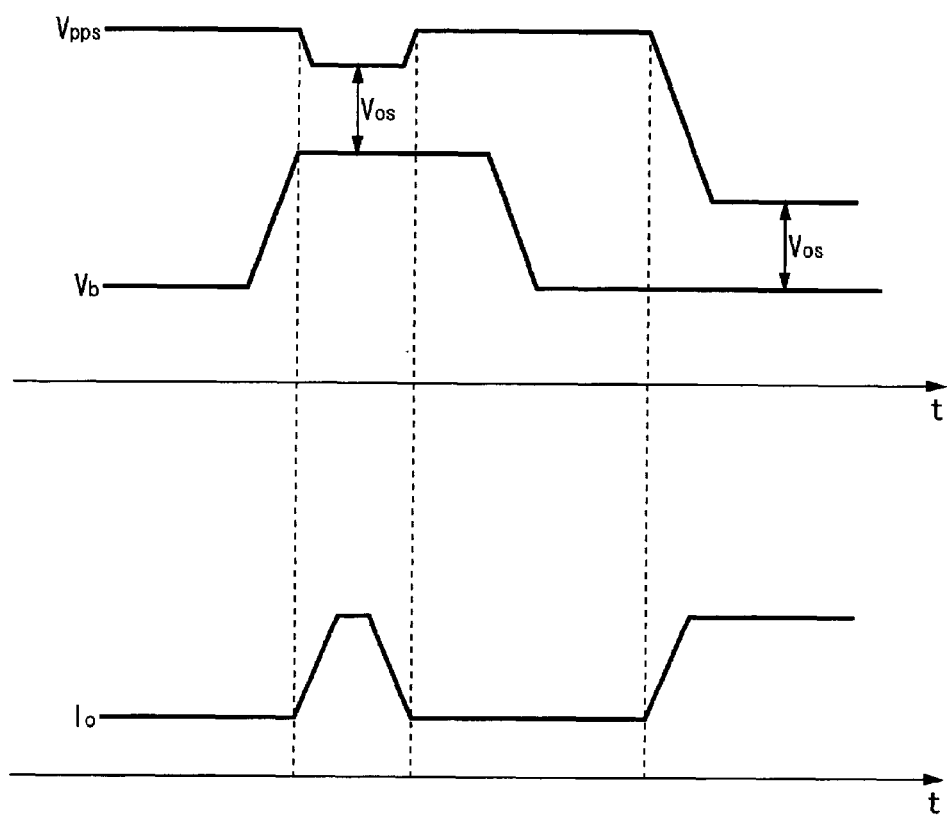
FIG. 7 shows an exemplary waveform of the source-side drive voltage $V_{PPS}$.

With reference to FIG. 7, there is shown an exemplary waveform of the source-side drive current $V_{PPS}$. As already discussed above, the positive voltage control unit 24 controls the source-side drive voltage $V_{PPS}$ according to the variation in power supply current ($I_o$). At this time, control of the source-side drive voltage $V_{PPS}$ is provided so that the result of a subtraction of the power supply voltage Vb from the source-side drive voltage $V_{PPS}$ never falls below the predetermined voltage value $V_{OS}$. By such control, it becomes possible to reduce the amount of consumption power in the power device 40 while providing voltage source required by the power device 40.

Such control can be provided by applying an output voltage from the current detection unit 34, in stead of the power supply voltage Vb, to the offset circuit 74, for example, in the voltage control unit's circuit shown in FIG. 4. At this time, for example, the lower limit of a pulse width generated by the pulse width controller 64 is defined based on the power supply voltage Vb, thereby making it possible to prevent the source-side drive voltage $V_{PPS}$ from becoming lower than the result of an addition of the predetermined value $V_{OS}$ to the power supply voltage Vb. Additionally, also by adjusting the set value of the saturation prevention circuit 72 by the power supply voltage Vb, the source-side drive voltage $V_{PPS}$ is prevented from becoming lower than the result of an addition of the predetermined value $V_{OS}$ to the power supply voltage Vb.

Figure 8:
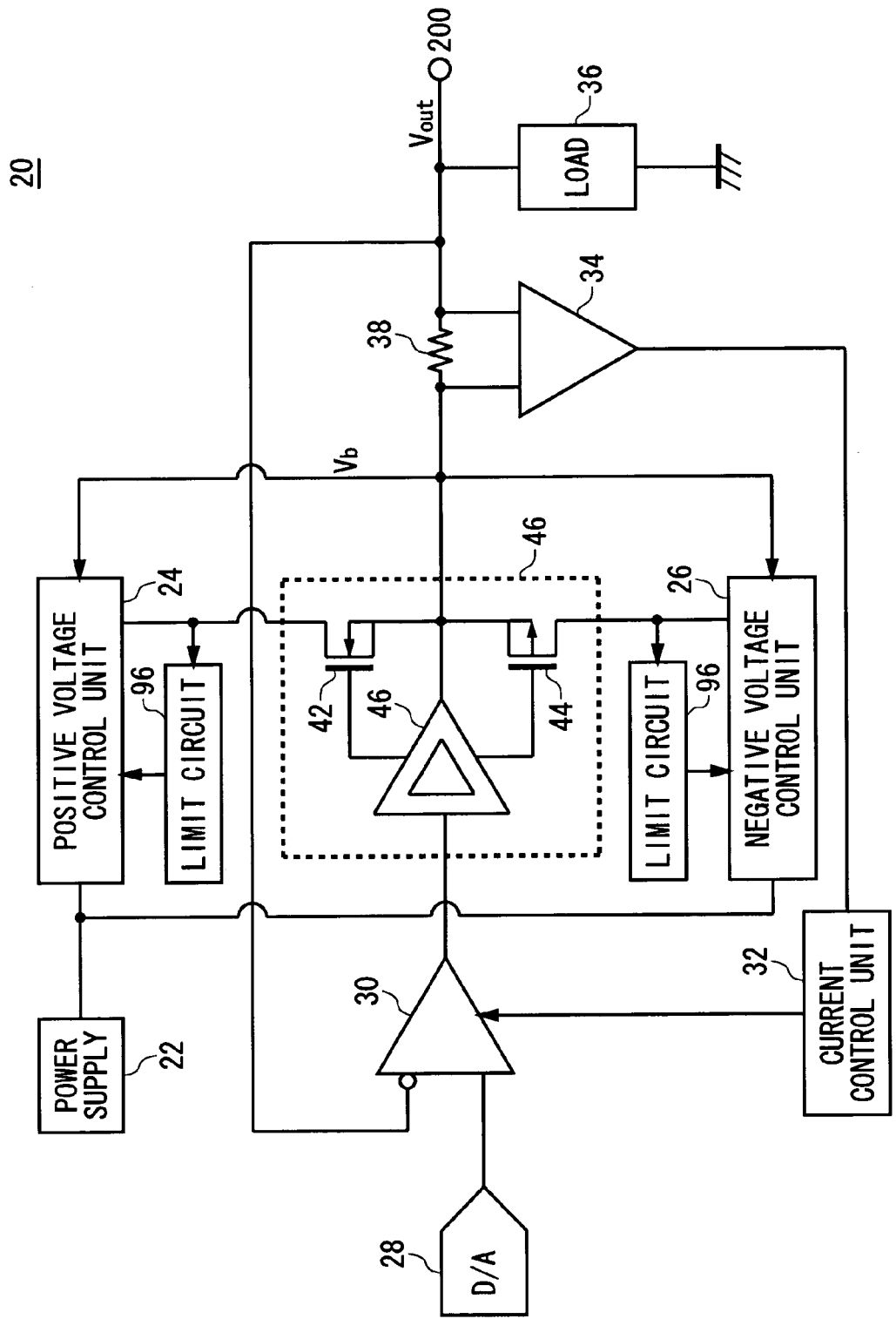
FIG. 8 shows still another exemplary configuration of the power supply circuit 20.

With reference to FIG. 8, there is shown still another exemplary configuration of the power supply circuit 20. In addition to the configuration of the power supply circuit 20 described in conjunction with FIG. 2, the power supply circuit 20 of the present embodiment further includes a limit circuit 96. Components in FIG. 8, which bear the same reference numerals as in FIG. 2, may act and be configured in the same way as their counterpart components described in conjunction with FIG. 2. Additionally, like the power supply circuit 20 described in conjunction with FIG. 6, the power supply circuit 20 of the present embodiment controls the drive voltage applied to the power device 40 based on the power supply current output from the power device 40.

The positive voltage control unit 24 and the negative voltage control unit 26 prevent the drive voltage from following the variation in power supply voltage (Vb) by lowering the ratio of amplification of the amplifier 66 described with reference to FIG. 4, and vary the drive voltage according to the power supply current by the line impedance of a transmission line for power supply current transmission from the power supply 22 to the power device 40. Additionally, the limit circuit 96 controls each of the voltage control units so that the drive voltage applied to the power device 40 never falls below the voltage, i.e., the result of an addition of a predetermined value to the power supply voltage.

For example, the limit circuit 96 detects a drive voltage and a power supply voltage, thereby to increase a pulse width in the pulse width controller 64 when the drive voltage falls below the voltage obtained by an addition of a predetermined value to the power supply voltage.

Such a configuration also makes it possible to reduce the amount of consumption power in the power device 40 while providing voltage source required by the power device 40, as in the power supply circuit 20 described in conjunction with FIG. 6.

Figure 9:
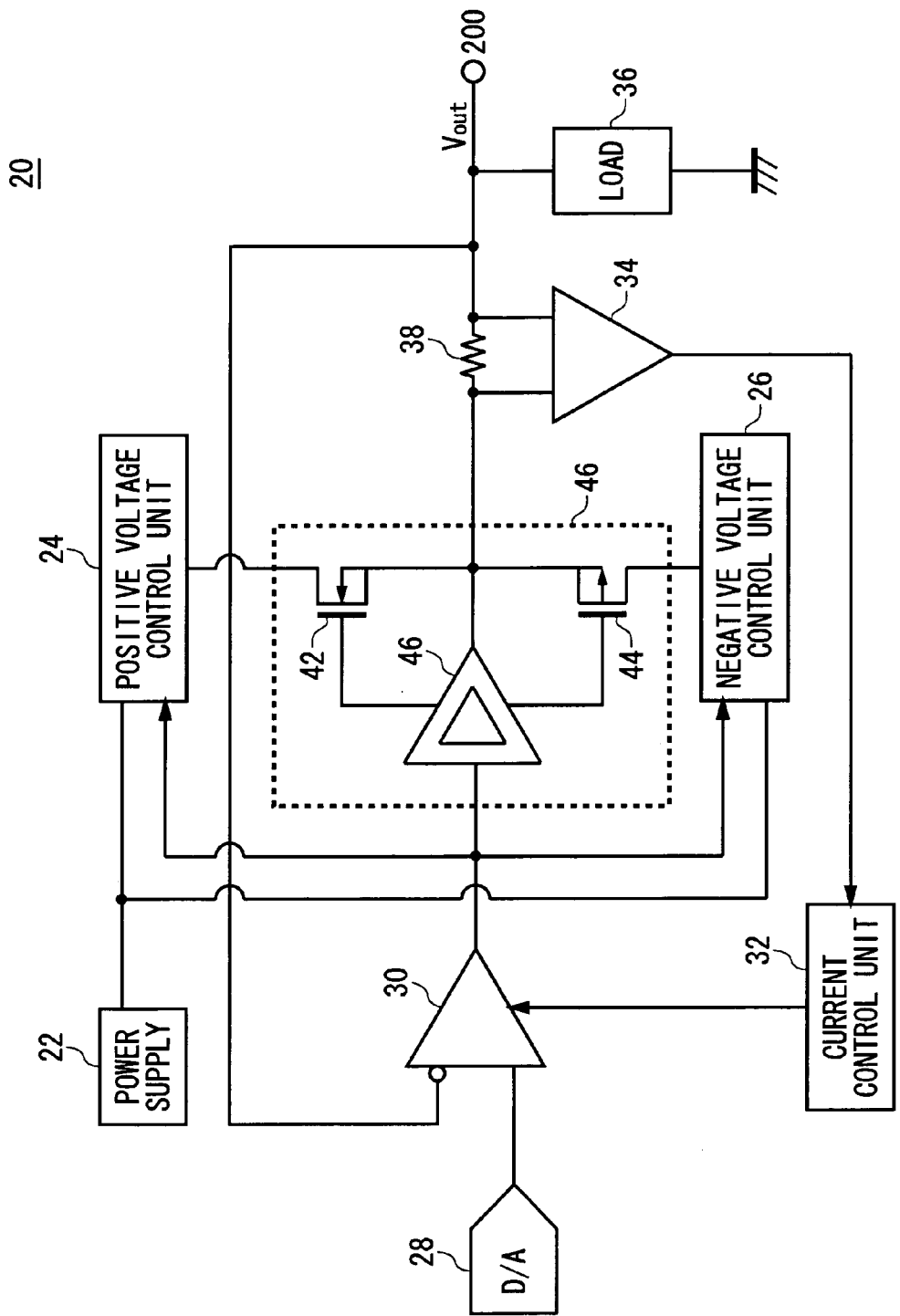
FIG. 9 shows a further exemplary configuration of the power supply circuit 20.

With reference to FIG. 9, there is shown a further exemplary configuration of the power supply circuit 20. The power supply circuit 20 of the present embodiment is substantially identical in configuration with the power supply circuit 20 described in conjunction with FIG. 2. Components in FIG. 6 which bear the same reference numerals as in FIG. 2 may act and be configured in the same way as their counterpart components described in conjunction with FIG. 2.

The power supply circuit 20 of the present embodiment operates differently from the power supply circuit 20 described in conjunction with FIG. 2 in that detection of an input voltage applied to the power device 40 is made, and that control of a drive voltage applied to the power device 40 is provided so that the differential between a power supply voltage output from the power device 40 and the input voltage may be held substantially constant. The amplification circuit 46 of the present embodiment is a circuit operable to output a power supply voltage approximately equal to the input voltage.

It is possible to provide such control by applying the above-mentioned input voltage, in stead of the power supply voltage Vb, to the offset circuit 74, in the voltage control unit's circuit shown in FIG. 4. Also according to the power supply circuit 20 of the present embodiment, it is possible to reduce the amount of consumption power in the power device 40, as in the power supply circuit 20 described in conjunction with FIG. 2.

As is clear from the above, the present invention is able to provide a power supply circuit capable of consumption power reduction.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

What is claimed is:

1. A testing apparatus for testing an electronic device, comprising:
   a pattern generation unit for generating a test pattern which is supplied to the electronic device;
   a power supply circuit for supplying power to the electronic device; and
   a decision unit for deciding pass/fail of the electronic device based on an output signal output from the electronic device, wherein said power supply circuit comprises:
   a voltage source for generating a predetermined input voltage to be applied to the electronic device;
   a power device for supplying the power to the electronic device based on the input voltage generated by said voltage source;
   a power supply for supplying drive power of said power device; and
   a voltage control unit for controlling a drive voltage applied by said power supply to said power device based on the power output from said power device.

2. The testing apparatus as claimed in claim 1, wherein said power device comprises:
   an amplification circuit for applying to the electronic device a voltage according to the input voltage;
   a source-side circuit for supplying a source current to the electronic device according to the input voltage; and
   a sink-side circuit for drawing a sink current from the electronic device according to the input voltage, said voltage control unit comprises:
   a positive voltage control unit for controlling a source-side drive voltage applied by said power supply to said source-side circuit based on the power output from said power device; and
   a negative voltage control unit for controlling a sink-side drive voltage applied by said power supply to said sink-side circuit based on the power output from said power device.

3. The testing apparatus as claimed in claim 1, wherein said voltage control unit detects a power supply voltage output from said power device, thereby to increase the drive voltage to increase when there is an increase in power supply voltage and decrease the drive voltage when there is a decrease in power supply voltage.

4. The testing apparatus as claimed in claim 3, wherein said voltage control unit controls the drive voltage so that a differential between the power supply voltage and the drive voltage may be held substantially constant.

5. The testing apparatus as claimed in claim 1, wherein said voltage control unit detects a power supply current output from said power device, thereby to increase the drive voltage when there is a decrease in power supply current and increase the drive voltage when there is an increase in power supply current.

6. The testing apparatus as claimed in claim 5, wherein said voltage control unit further detects a power supply voltage output from said power device, thereby to control the drive voltage so that the result of a subtraction of the power supply voltage from the drive voltage never falls below a predetermined value.

7. The testing apparatus as claimed in claim 1, wherein said power device outputs a power supply voltage which is approximately equal to the input voltage, and wherein said voltage control unit detects the input voltage, thereby to control the drive voltage so that a differential between the power supply voltage and the input voltage may be held substantially constant.

8. The testing apparatus as claimed in claim 4, wherein said voltage control unit comprises:

an offset circuit, which is pre-fed said differential between the power supply voltage and the drive voltage to be controlled, for performing an addition of the differential to the detected power supply voltage; and a driver for controlling the drive voltage based on a differential between a predetermined reference voltage and the power supply voltage output from said offset circuit.

9. The testing apparatus as claimed in claim 8, wherein said voltage control unit further comprises a saturation prevention circuit for clamping said detected power supply voltage to within a predetermined voltage range.

* * * * *